United States Patent [19]

Harwood et al.

[11] 4,325,076

[45] Apr. 13, 1982

[54] ELECTRONIC FILTER FOR GENERATING A THIRD HARMONIC SIGNAL

[75] Inventors: Leopold A. Harwood, Bridgewater; Erwin J. Wittmann, North Plainfield, both of N.J.

[73] Assignee: RCA Corporation, New York, N.Y.

[21] Appl. No.: 147,580

[22] Filed: May 8, 1980

[51] Int. Cl.³ .......................................... H04N 9/535
[52] U.S. Cl. ........................................ 358/31; 331/76
[58] Field of Search .............. 358/31; 331/76; 328/16; 307/260; 455/109, 59

[56] References Cited

U.S. PATENT DOCUMENTS

| 2,373,275 | 4/1945 | Thomas | 331/76 |
| 2,946,963 | 7/1960 | Lee | 331/38 |
| 3,060,364 | 10/1962 | Holcomb | |
| 4,019,118 | 4/1977 | Harwood | 331/76 |
| 4,096,516 | 6/1978 | Pritchard | 358/31 |

OTHER PUBLICATIONS

"Odd-Order Frequency Multiple Generation Technique" *Electronic Letters*, Apr. 1976, vol. 12, No. 7, pp. 159–160.

Primary Examiner—Richard Murray
Attorney, Agent, or Firm—Eugene M. Whitacre; Paul J. Rasmussen; Ronald H. Kurdyla

[57] ABSTRACT

An integratable third harmonic signal generator comprises an amplitude limiting amplifier, a linear amplifier, and a signal combining network. A sinusoidal input signal is coupled to the limiter and linear amplifiers. The limiting amplifier generates a square wave signal containing a first harmonic (fundamental) component at the frequency of the input signal, and higher order odd harmonics including a desired third harmonic frequency. The signal gain of the linear amplifier is set so that the magnitude of the output signal from the linear amplifier is sufficient to cancel with the first harmonic of the square wave output signal from the limiter amplifier, when these output signals are combined in the combining network. A resulting signal developed at the output of the combining network contains the desired third harmonic component, as well as higher order harmonics at acceptably reduced levels relative to the third harmonic component, to the substantial exclusion of the first harmonic component.

5 Claims, 3 Drawing Figures

ELECTRONIC FILTER FOR GENERATING A THIRD HARMONIC SIGNAL

This invention relates to a third harmonic signal generator circuit suitable for fabrication in an integrated circuit.

Third harmonic signals are employed in a variety of electrical circuit applications. For example, such signals can be used as switching (timing) signals for an active delay line in luminance or chrominance signal processing channels of a color television receiver. An active luminance delay line can provide matching of the video signal transit time of the luminance channel with the signal transit time, or delay, which is typically observed for the chrominance signal processing channel of the receiver. Luminance and chrominance delay lines can also be used in "comb" filtering applications. Such delay lines commonly comprise an array of charge transfer devices responsive to a switching signal at a frequency two or three times greater than the highest frequency associated with video signals processed by the delay line. One advantageous switching frequency is the third harmonic of the color subcarrier frequency of the video signal (e.g., 10.7 MHz switching frequency) when the color subcarrier frequency is 3.58 MHz, according to United States television broadcast standards.

In general, a third harmonic signal employed for this or other purposes should be free of the first harmonic frequency, and should exhibit significant suppression of or be free of higher harmonics other than the desired third harmonic to avoid contaminating the processed signal (which may include signal components of such first harmonic frequency). The use of extensive tuned circuit filtering to extract the third harmonic from a signal containing harmonic frequencies less than and greater than the third harmonic frequency is undesirable, since such filtering adds to circuit size, cost and complexity. Also, arrangements employing tuned circuits may render the integration of the third harmonic signal generator impractical because of the limited surface area of an integrated circuit chip, and because of the limited number of terminals that are available for connection to external circuit components.

Accordingly, in accordance with the principles of the present invention there is disclosed herein an uncomplicated, economical third harmonic signal generator capable of being fabricated as an integrated circuit.

The disclosed third harmonic signal generator is particularly advantageous in a color television signal processing system including one integrated circuit including a comb filter employing charge coupled devices or the like for providing combed luminance and chrominance components of the television signal at respective outputs, and another integrated circuit for processing at least the combed chrominance component from the comb filter. In such a system the charge coupled device comb filter typically is clocked by a signal with a frequency (e.g., 10.7 MHz) that is a third multiple of the frequency of a locally generated reference signal at the frequency of the color subcarrier (e.g., 3.58 MHz). When the comb filter clock signal is derived from the color reference signal, it is important that the color reference signal does not contaminate the combed chrominance signal from the comb filter. This result can be accomplished effectively and simply with an integrated third harmonic signal generator according to the present invention in a system of the type described.

A third harmonic signal generator according to the present invention includes a source of sinusoidal input signals, a limiting amplifier, a linear amplifier, and a combining network. The limiting amplifier responds to the sinusoidal signal for providing a substantially square wave output signal comprising a fundamental component at the frequency of the sinusoidal signal and higher order harmonic frequencies including a third harmonic component. The linear amplifier responds to the sinusoidal signal for providing a sinusoidal output signal with a magnitude substantially equal to the magnitude of the fundamental component of the square wave output signal. The combining network combines the output signals from the limiting and linear amplifiers with a sense for substantially cancelling the fundamental component. A resulting signal at the output of the combining network comprises the desired third harmonic component and higher order harmonics of lesser magnitude relative to the third harmonic component, to the substantial exclusion of the fundamental component.

In accordance with a feature of the present invention, the disclosed third harmonic signal generator is included in a color television signal processing system comprising a first integrated circuit device including chrominance signal processing circuits and the third harmonic generator, and a second integrated circuit device comprising a charge transfer device comb filter responsive to an input composite video signal containing luminance and chrominance components, for providing combed luminance and chrominance components at respective outputs. The combed chrominance component from the second integrated circuit is applied to the chrominance processing circuits in the first integrated circuit. The first integrated circuit also includes a color reference oscillator for generating a reference signal at the color subcarrier frequency. The reference signal is processed by the third harmonic generator for developing a signal corresponding to the third harmonic of the reference signal. The third harmonic signal is applied from the first integrated circuit device to the second integrated circuit for use as a switching signal by the comb filter. This arrangement minimizes the likelihood that the combed chrominance output from the comb filter will be contaminated by the color reference signal.

Figure 1:
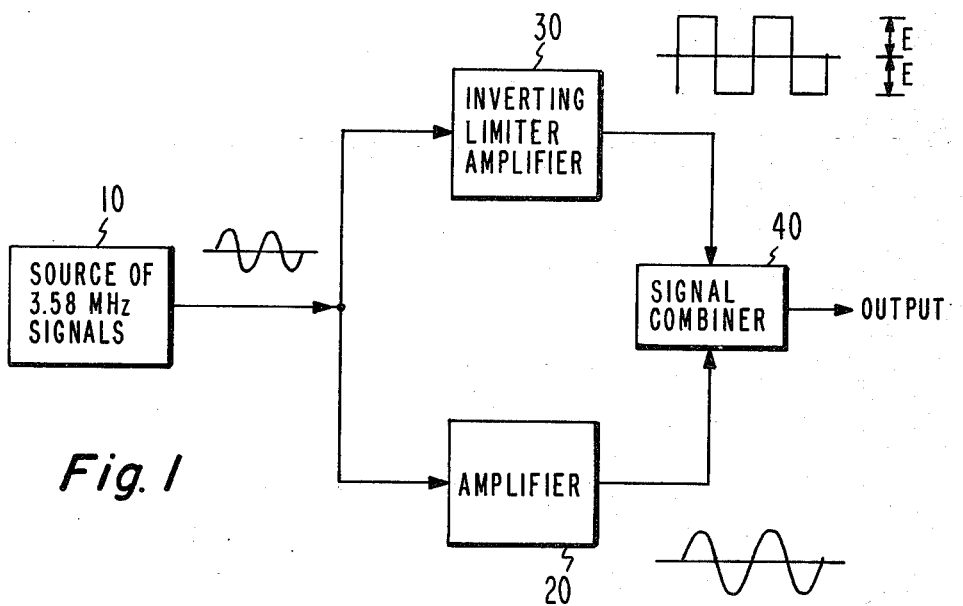
FIG. 1 shows a block diagram of a portion of a color television receiver including a third harmonic signal generator according to the present invention.

Referring to FIG. 1, a source of signals 10, such as a color reference oscillator of a color television receiver, provides a continuous wave sinusoidal signal at the frequency of the color subcarrier signal. The frequency of this signal (3.579545 MHz) is commonly referred to as 3.58 MHz. In this example, this signal is of the form $\cos\omega t$ (hereinafter referred to as $\cos\theta$) and is supplied to an input of a linear amplifier 20 and to an input of a signal inverting amplitude limiter amplifier 30.

Limiter amplifier 30 provides a symmetrical square wave output signal which, according to Fourier analysis, has components and is of a magnitude given by the expression $$-\frac{4}{\pi} E(\cos\theta - \tfrac{1}{3}\cos3\theta + 1/5\cos5\theta - 1/7\cos7\theta \ldots) \quad (1)$$

where E is the peak amplitude of the square wave signal (i.e., one-half the peak-to-peak amplitude defined by the limiting levels of the square wave signal).

Amplifier 20 provides a continuous wave amplified version of the signal from source 10 at an output. The gain of amplifier 20 is set so that this output signal is $$\frac{4}{\pi} E \cos\theta. \quad (2)$$

In this example, the signal gain of amplifier 20 is set so that the magnitude of this output signal is sufficient to cancel with the magnitude of the first harmonic component of the square wave signal from limiter 30 as given by expression (1), when the output signals from amplifier 20 and limiter 30 are combined in a signal combiner 40. A resulting signal developed at the output of combiner 40 is of the form $$-\frac{4}{\pi} E(\tfrac{1}{3}\cos3\theta + 1/5\cos5\theta - 1/7\cos7\theta \ldots). \quad (3)$$

This resulting output signal is devoid of the first harmonic frequency component but contains the third harmonic component and higher order odd harmonic components. The third harmonic component is sufficiently greater in magnitude than the higher order harmonics such that the effect of the higher order harmonics can be disregarded for most purposes. If necessary in accordance with the requirements of a particular system, however, the magnitude of the higher order harmonics can be reduced by means of a relatively simple and inexpensive low pass filter coupled to the output of combiner 40.

Figure 2:
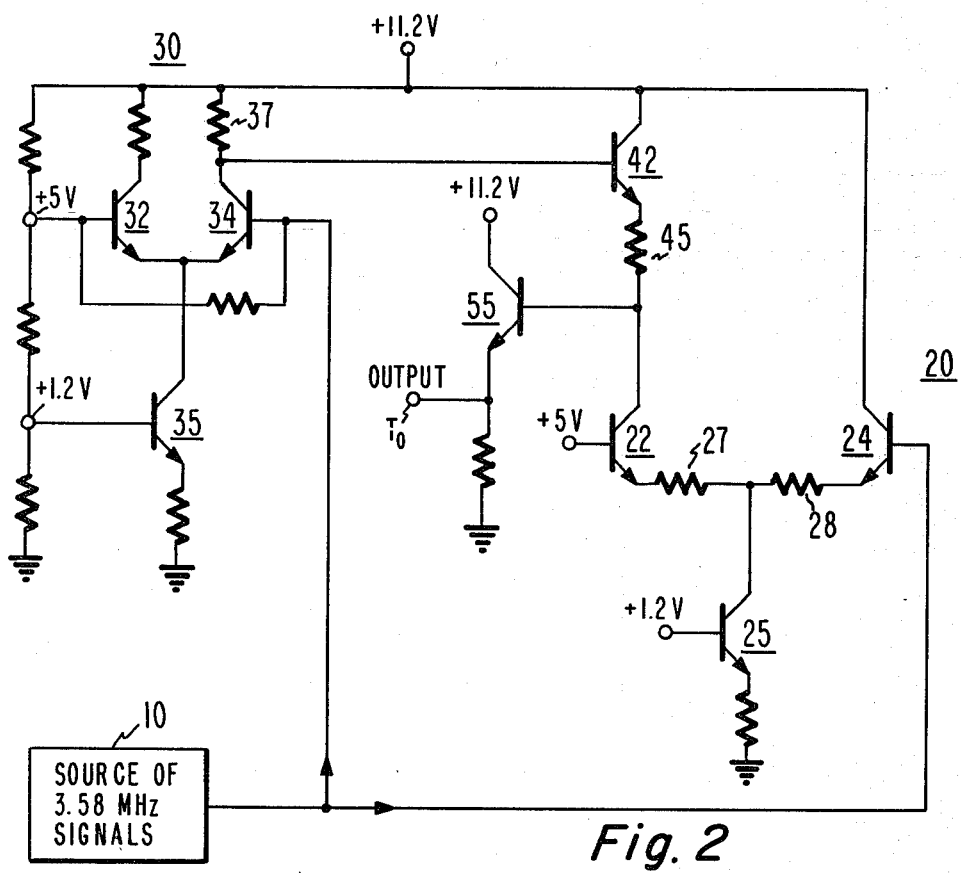
FIG. 2 illustrates a schematic circuit diagram of a portion of the arrangement of FIG. 1.

FIG. 2 shows amplifiers 20, 30 and combiner 40 in circuit form.

Amplifier 20 comprises differentially connected transistors 22 and 24, and an associated current source 25. Limiter amplifier 30 comprises differentially connected transistors 32 and 34, and an associated current source transistor 35. Signals from source 10 are applied to a base input of transistor 24 in amplifier 20, and to a base input of transistor 34 in amplifier 30. Square wave output signals from amplifier 30 appear at the inverting collector output circuit of transistor 34, and output signals from amplifier 20 appear at the non-inverting collector output circuit of transistor 22. The output signals from limiter 30 are coupled via a follower transistor 42 to a signal combining resistor 45 in the collector circuit of transistor 22, where the output signals from amplifiers 20 and 30 are combined to produce the desired third harmonic output signal given by expression (3) above. This signal is coupled to an output terminal $T_0$ via a follower transistor 35.

The peak amplitude of the square wave output signal from limiter amplifier 30 can be adjusted by tailoring the value of a collector load resistor 37 and by adjusting the current conducting level of current source transistor 35. The signal gain of amplifier 20 can be adjusted by tailoring the values of collector resistor 45 and emitter degeneration resistors 27 and 28. It is also noted that in other embodiments of the disclosed third harmonic signal generator amplifier 20 may comprise an inverting amplifier while amplifier 30 comprises a non-inverting limiter amplifier. Alternatively, amplifiers 20 and 30 may both comprise non-inverting amplifiers in a system wherein combiner 40 comprises a subtractive combiner for cancelling the first harmonic component.

Figure 3:
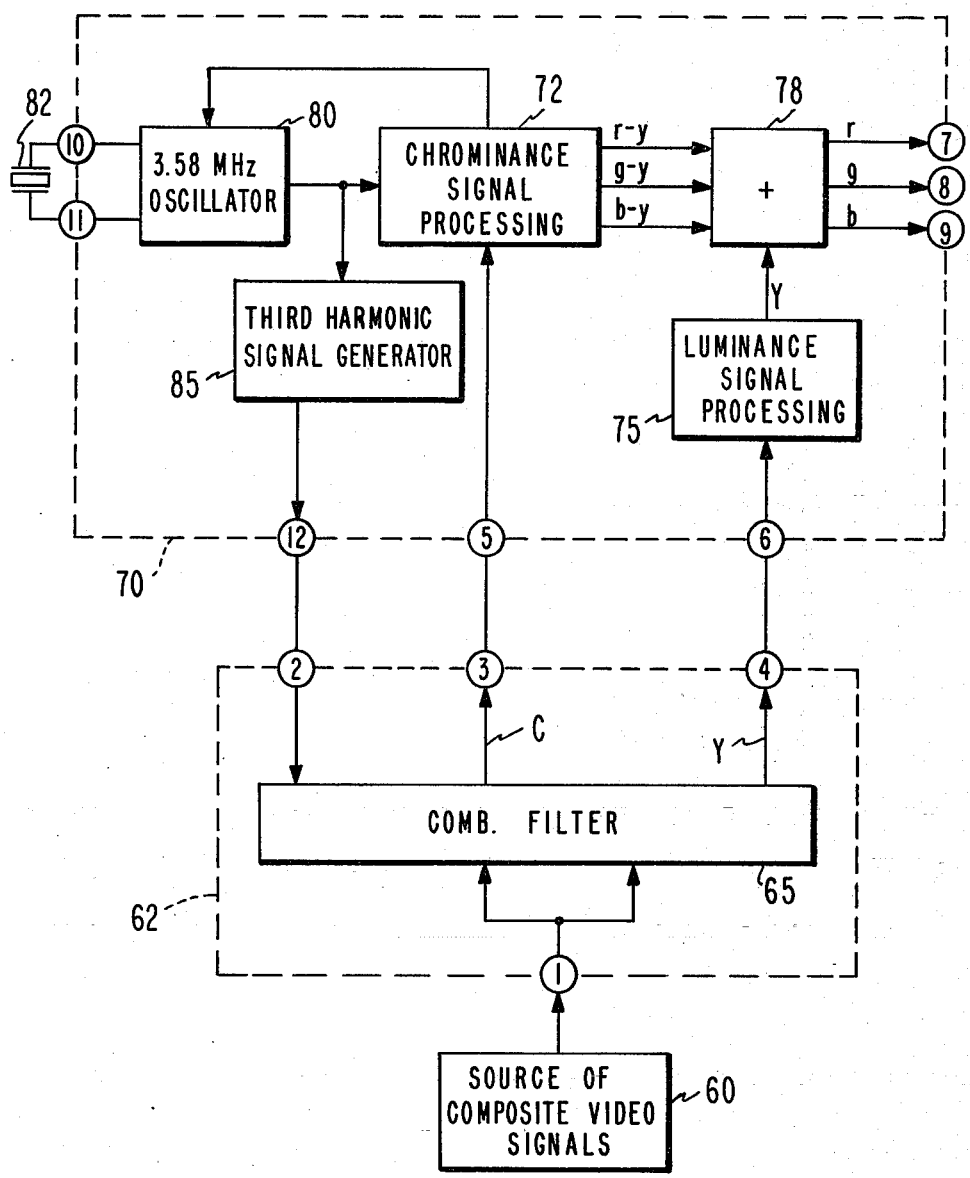
FIG. 3 shows additional details of a portion of a color television receiver including a third harmonic signal generator according to the present invention.

FIG. 3 shows additional details of a color television signal processing system including a third harmonic signal generator as discussed previously. The system of FIG. 3 includes first and second monolithic integrated circuits 62 and 70. Integrated circuit 62 comprises a comb filter 65 (e.g., as described in copending U.S. patent application Ser. No. 930,379 of J. E. Carnes, et al., now U.S. Pat. No. 4,217,605, entitled, "Comb Filter Employing A Charge Transfer Device With Plural Mutually Proportioned Signal Charge Inputs"). Comb filter 65 processes the frequency interleaved luminance and chrominance components of the color television signal to provide combed luminance and chrominance components at separate outputs. Integrated circuit 70 comprises an arrangement for processing luminance and chrominance components of a composite color television signal as supplied from integrated circuit 62.

Composite video signals from a source 60 are supplied to inverting and non-inverting signal inputs of comb filter 65 via an external terminal 1. In this example, comb filter 65 comprises an arrangement of charge coupled devices (CCDs) responsive to switching signals received via an external terminal 2, as will be discussed, for providing mutually combed chrominance (C) and luminance (Y) signals at external output terminals 3 and 4. The combed luminance and chrominance signals are applied to respective external input terminals 5 and 6 of integrated circuit 70 after processing by bandpass filter and signal translating circuits (not shown).

Integrated circuit 70 includes a chrominance processor 72 for deriving r−y, g−y and b−y color difference signals from the combed chrominance signal, and a luminance processor 75 for providing a translated version of the combed luminance signal. Output signals from processor 72 and processor 75 are combined in a matrix 78 for providing r, g, and b color image representative signals that are ultimately applied to an image reproducing kinescope of the receiver.

Integrated circuit 70 also includes a voltage controlled color reference oscillator 80 (e.g., of the type shown in U.S. Pat. No. 4,020,500) operatively associated with chrominance processor 72. Oscillator 80 includes a frequency determining crystal filter 82 coupled between integrated circuit terminals 10 and 11 and serves to provide a sinusoidal reference signal at the color subcarrier frequency for use by processor 72.

In this example the charge coupled devices forming comb filter 65 are timed to operate in response to a switching signal of approximately 10.7 MHz, which is three times the frequency of the reference signal developed by oscillator 80 (commonly referred to as 3.58 MHz). This switching signal is a third harmonic version of the 3.58 MHz oscillator reference signal, and is developed from the 3.58 MHz oscillator signal by means of a third harmonic signal generator 85 which is also included in integrated circuit 70. The elements of signal generator 85 correspond to elements 20, 30 and 40 as shown and discussed in connection with FIG. 1. Integrated circuit 62 receives the third harmonic switching signal via terminals 12 and 2.

The arrangement of FIG. 3 serves to minimize the likelihood that the combed chrominance output from comb filter 65 will be contaminated by the color reference signal, since the reference signal as used to develop the comb filter switching signal is isolated from the comb filter.

What is claimed is:

1. A third harmonic signal generator comprising:
   means for providing a sinusoidal input signal;
   limiting amplifier means responsive to said sinusoidal signal for providing a substantially square wave output signal comprising a fundamental component at the frequency of said sinusoidal signal and higher order harmonics including a third harmonic component;
   linear amplifier means responsive to said sinusoidal signal for providing a sinusoidal output signal with a magnitude substantially equal to the magnitude of said fundamental component of said square wave output signal; and
   means for combining output signals from said limiting and linear amplifier means with a sense for substantially cancelling said fundamental component so as to produce a signal at an output of said combining means comprising said desired third harmonic component and higher order harmonics of lesser magnitude relative to said third harmonic component to the substantial exclusion of said fundamental component.

2. A signal generator according to claim 1, wherein:
   one of said limiting and linear amplifier means comprises a signal inverting amplifier to the exclusion of the other of said amplifier means; and
   said signal combining means comprises a signal summing network.

3. A signal generator according to claim 2, wherein:
   said limiting amplifier means comprises an output load impedance;
   said linear amplifier means comprises an output load impedance; and wherein
   output signals from said limiting and linear amplifier means are summed in the load impedance of one of said limiting and linear amplifier means for cancelling said fundamental component to thereby produce said output signal including said third harmonic component to the substantial exclusion of said fundamental component.

4. A third harmonic signal generator comprising:
   means for providing a sinusoidal input signal;
   limiting amplifier means responsive to said sinusoidal signal for providing a symmetrical square wave output signal confined to signal excursions between first and second limiting levels and exhibiting relatively rapid transitions between said limiting levels, and comprising a fundamental component at the frequency of said sinusoidal signal and higher order harmonics including a third harmonic component;
   linear amplifier means responsive to said sinusoidal signal for providing a sinusoidal output signal with a magnitude substantially equal to $2/\pi$ times the peak-to-peak amplitude of said square wave signal as defined by said limiting levels; and
   means for combining output signals from said limiting and linear amplifier means with a sense for substantially cancelling said fundamental component so as to produce a signal at an output of said combining means comprising said desired third harmonic component and higher order harmonics of lesser magnitude relative to said third harmonic component to the substantial exclusion of said fundamental component.

5. In a color television receiver for processing a color television signal with a luminance component frequency interleaved with a chrominance component including a color subcarrier, said receiver including a source of sinusoidal reference signals at the frequency of said color subcarrier; means for processing said chrominance component; a charge transfer device comb filter responsive to a timing signal and to said television signal for providing an output combed chrominance component and an output combed luminance component; and a source of timing signals for said comb filter; wherein:
   said comb filter is realized in integrated circuit form in a first monolithic integrated circuit device with a common substrate;
   said chrominance processing means, said source of reference signals and said source of timing signals are realized in integrated circuit form in a second monolithic integrated circuit device with a common substrate, said source of timing signals comprising
      limiting amplifier means responsive to said sinusoidal reference signal for providing a substantially square wave output signal comprising a fundamental component at the frequency of said reference signal and higher order harmonics including a third harmonic component;
      linear amplifier means responsive to said sinusoidal reference signal for providing a sinusoidal output signal with a magnitude substantially equal to the magnitude of said fundamental component of said square wave output signal; and
      means for combining output signals from said limiting and linear amplifier means with a sense for substantially cancelling said fundamental component so as to produce a signal at an output of said combining means comprising said desired third harmonic component and higher order harmonics of lesser magnitude relative to said third harmonic component to the substantial exclusion of said fundamental component; and wherein
   said receiver further includes
      means external to said first and second integrated circuits for coupling said combed chrominance component from said first integrated circuit to said chrominance processing means in said second integrated circuit; and
      means external to said first and second integrated circuits for coupling said output signal from said combining means in said second integrated circuit to said comb filter in said first integrated circuit as said comb filter timing signal.

* * * * *